United States Patent [19]

Dahms

[11] 4,181,582

[45] Jan. 1, 1980

[54] GALVANIC ACID COPPER BATH AND METHOD

[75] Inventor: Wolfgang Dahms, Berlin, Fed. Rep. of Germany

[73] Assignee: Schering Aktiengesellschaft, Berlin and Bergkamen, Fed. Rep. of Germany

[21] Appl. No.: 947,746

[22] Filed: Oct. 2, 1978

[30] Foreign Application Priority Data

Oct. 17, 1977 [DE] Fed. Rep. of Germany ....... 2746938

[51] Int. Cl.$^2$ .................................................. C25D 3/38
[52] U.S. Cl. .................................................. 204/52 R
[58] Field of Search ............... 204/52 R, 44, 106, 107, 204/108

[56] References Cited

U.S. PATENT DOCUMENTS

| 2,798,040 | 7/1957 | Pye et al. | 204/108 |
| 2,888,390 | 5/1959 | Lapee | 204/108 |
| 2,954,331 | 9/1960 | Abbott | 204/52 R |
| 3,287,236 | 11/1966 | Brugger et al. | 204/52 R |
| 3,804,729 | 4/1974 | Kardos et al. | 204/52 R |

FOREIGN PATENT DOCUMENTS 49-31183  8/1974  Japan ...................................... 204/52 R

*Primary Examiner*—G. L. Kaplan
*Attorney, Agent, or Firm*—Michael J. Striker

[57] ABSTRACT

An improved galvanic acid copper bath for the deposition of shiny coatings, particularly suited for the strengthening of the conductor paths of printed circuits, which comprises the addition to standard electrolytic aqueous solutions of mineral acids and copper salts of (a) an amide of the general formula R—CO—NH$_2$, where R is an aliphatic or aromatic hydrocarbon monomer or polymer residue, (b) an oxygen-containing high molecular weight compound and (c) an organic sulfur compound with water-solubilizing groups.

10 Claims, No Drawings

GALVANIC ACID COPPER BATH AND METHOD

BACKGROUND OF THE INVENTION

The invention relates to an improved acid galvanic copper bath for the deposition of shiny coatings, that in particular are suited for the strengthening of the conductor paths of printed circuits.

It has long been known to combine galvanic copper baths with specified organic substances in order to obtain a shiny coating. However, this process induces multiple deteriorations in the mechanical properties of the material so treated, in particular in the hardness and elongation-to-point-of-fracture properties, as well as the inertness characteristics, which then necessitate a subsequent activation process in preparation for further treatment. In addition, many inhibitors worsen the metal dispersion, so that gaps or cracks develop at boreholes and at edges, in particular when the copper layer is treated in a thermal process such as, for example, the soldering of printed circuits.

The many known compounds for use in this process, for example thiourea, thiohydantoin, thiocarbamic acid esters or thiophosphoric acid esters, are for the above purpose of no practical importance, in that the quality of the copper coating obtained through their use, in particular the hardness and elongation-to-point-of-fracture properties, are very poor. Further, the combination of the above compounds with other supplemental compounds, such as ethylene oxide-addition compounds of polyamines, does not lead to the desired outcome.

SUMMARY OF THE INVENTION

An object of the present invention is therefore the development of a galvanic copper bath, which is suitable for the deposition of shiny copper coatings and the strengthening of the conductor paths of printed circuits without the development of cracks or gaps and which offers improved elongation-to-point-of-fracture properties.

Pursuant to this and still further objects one aspect of the invention resides in a galvanic copper bath which comprises (a) an amide of the general formula

R—CO—NH$_2$, where R is an aliphatic or aromatic hydrocarbon monomer or polymer residue, (b) an oxygen-containing, high molecular weight compound, and (c) an organic sulfur compound with water-solubilizing groups.

The inventive bath makes possible to a great extent the galvanic deposition of a copper coating with an especially uniform luster, which in addition has the surprising advantage of a good metal distribution and exceptional elongation-to-point-of-fracture properties. The coatings prepared through use of the inventive bath are therefore especially well-suited for the strengthening of conductor paths for printed circuits.

The individual components in the inventive bath seem to increase each other's efficacy in their simultaneous use, despite the fact that the use of any one of them alone will not lead to acceptable results.

The individual components of the inventive bath are already known in the art and can be prepared in known manner.

In the following Table are given some amides, which can be used as component (a), as well as the preferred concentrations of these compounds for use in the bath.

TABLE I

| Component a) | Preferred Concentration g/liter |
|---|---|
| Acetamid | 0.05–2 |
| Propionic acid amide | 0.05–2 |
| Acrylic acid amide | 0.01–1 |
| Benzoic acid amide | 0.02–2 |
| Polyacrylic acid amide | 0.01–1 |

The polyacrylic acid amide has the general formula

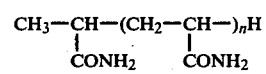

in which n is 0 or an integer between 1 and 40, preferably 0 or 1 to 16, with a molecular weight of 73 to 1600, preferably between 600 to 1000.

The following Table II shows examples of oxygen-containing high molecular weight compounds for use as component (b) and the preferred concentrations thereof for use in the bath.

TABLE II

| Component b) | Preferred Concentration g/liter |
|---|---|
| Polyvinylalcohol | 0.05–0.4 |
| Carboxymethylcellulose | 0.05–0.1 |
| Polyethyleneglycol | 0.1 –5.0 |
| Polypropyleneglycol | 0.05–1.0 |
| Stearic acid-polyglycolester | 0.5 –8.0 |
| Oleic acid-polyglycolester | 0.5 –5.0 |
| Stearylalcohol-polyglycolether | 0.5 –8.0 |
| Nonylphenol-polyglycolether | 0.5 –6.0 |
| Octanolpolyalkyleneglycolether | 0.05–0.5 |
| Octandiol through (polyalkylene-glycolether) | 0.05–0.5 |
| Polyoxypropyleneglycol | 0.05–0.5 |

The following Table II contains examples of organic sulfur compounds with water solubilizing groups which can be used as component (c), and the preferred concentrations for use in the bath.

TABLE III

| Component c) | Preferred Concentration g/liter |
|---|---|
| N,N-diethyl-dithiocarbamic acid-(ω-sulfopropyl)ester, sodium salt | 0.01–0.1 |
| Sodium mercaptobenzthiozol-S-propansulfonic acid | 0.02–0.1 |
| Sodium 3-mercaptopropan-1-sulfonic acid | 0.005–0.1 |
| Thiophosphoric acid-O-ethyl-bis-(ω-sulfopropyl)ester, disodium salt | 0.01–0.15 |
| Thiophosphoric acid-tris-(ω-sulfopropyl)ester, trisodium salt | 0.02–0.15 |
| Sodium isothiocyanopropylsulfonic acid | 0.05–0.2 |
| Thioglycolic acid | 0.001–0.003 |
| Sodium ethylenedithiodipropylsulfonic acid | 0.01–0.1 |
| Sodium thioacetamid-S-propylsulfonic acid | 0.005–0.03 |
| Di-n-propylthioether-di-107 -sul- | |

TABLE III-continued

| Component c) | Preferred Concentration g/liter |
|---|---|
| fonic acid, disodium salt | 0.01–0.1 |

The various components of the inventive copper bath can be used advantageously within the following concentration ranges:

Amide (component a)):
 0.001–20 g/liter, preferably 0.01–1 g/liter
Oxygen-containing, high molecular weight compound (component b)):
 0.005–20 g/liter, preferably 0.02–5 g/liter
Organic sulfur compound with water-solubilizing groups (component c)):
 0.0005–0.2 g/liter, preferably 0.005–0.1 g/liter.

The base solution of the inventive bath can vary within broad ranges. In general, an aqueous solution of the following composition is used:

Copper sulfate ($CuSO_4.5H_2O$):
 50–250 g/liter, preferably 60–80 g/liter
Sulfuric acid:
 50–250 g/liter, preferably 180–220 g/liter
Sodium chloride:
 0.05–0.25 g/liter, preferably 0.06–0.1 g/liter.

In place of at least a portion of the copper sulfate other copper salts can be used. In addition, the sulfuric acid can be partially or totally replaced by fluoroboric acid, phosphoric acid or other acids. The bath can also be chloride-free.

In addition, the bath may also contain customary luster builders and/or wetting agents.

To prepare the inventive bath, the components (a), (b) and (c) are added to the base solution.

The operating parameters of the bath are as follows:
pH value: less than 1
Temperature: 15°–35° C., preferably 25° C.
Current density: 0.5–8 $A/dm^2$, preferably 2–4 $A/dm^2$ The novel features which are considered as characteristic for the invention are set forth in particular in the appended claims. The invention itself may be better understood from the following description of specific embodiments.

DESCRIPTION OF THE PREFERRED EMBODIMENTS

EXAMPLE 1

To a copper bath of the following composition:
80 g/liter copper sulfate ($CuSO_4.5H_2O$)
180 g/liter concentrated sulfuric acid
0.08 g/liter sodium chloride is added as luster builder
0.06 g/liter polypropylene glycol and
0.02 g/liter sodium 3-mercaptopropan-1-sulfonic acid.

At an electrolyte temperature of 30° C. one obtains shiny coatings at a current density above 0.8 $A/dm^2$ and in comparison dull coatings with a current density below 0.8 $A/dm^2$.

If one then adds to the bath
0.1 g/liter propionamide or
0.02 g/liter acrylic acid amide or
0.04 g/liter benzoic acid amide or
0.08 g/liter acetamide, then the sample plate is coated with a shiny surface over the entire range of current density.

EXAMPLE 2

To a copper bath of the following composition:
60 g/liter copper sulfate ($CuSO_4.5H_2O$)
220 g/liter concentrated sulfuric acid
0.1 g/liter sodium chloride is added
4.0 g/liter nonylphenyl-polyglycolether and
0.02 g/liter N,N diethyldithiocarbamic acid ($\omega$-sulfopropyl)ester, sodium salt.

At a moderate current density of 2 $A/dm^2$ a printed circuit which has been coated through the additive technique strengthened for 60 minutes. After this process there appear around the bore holes dull flattened bumps, which become gaps or cracks after tinning.

If one adds to the above bath 20 mg/liter of polyacrylic acid amide with an average molecular weight of 660 g/mole, the bore holes are faultless, even after tinning.

EXAMPLE 3

A 40 micrometer copper foil, removed from a bath of the following composition:
80 g/liter copper sulfate ($CuSO_4.5H_2O$)
200 g/liter sulfuric acid (concentrated)
0.06 g/liter sodium chloride
and
0.4 g/liter octanolpolyalkyleneether
0.01 g/liter di-n-propylthioether-di-sulfonic acid, disodium salt shows an elongation-to-point-of-fracture factor of 18%. After the addition to the above bath of 0.01 g/liter polyacrylic acid amid with an average molecular weight of 1000 g/mole, this elongation factor is improved to 22%. With a total of 0.025 g/liter of polyacrylic acid amide the elongation-to-point-of-fracture is raised to the optimum value of 26%. Further additions raise the value of the elongation-to-point-of-fracture only insignificantly.

It will be understood that each of the elements described above, or two or more together, may also find a useful application in other types of improved galvanic acid copper bath differing from the types described above.

While the invention has been illustrated and described as embodied in an improved galvanic acid copper bath, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A galvanic acid copper bath, comprising a standard aqueous bath of a copper salt and mineral acid and added thereto (a) an amide of the general formula

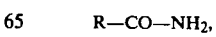

R—CO—NH$_2$, where R is an aliphatic or aromatic hydrocarbon monomer or polymer;

(b) an oxygen-containing, high molecular weight compound selected from the group consisting of polyvinylalcohol, carboxymethylcellulose, polyethylene glycol, polypropylene glycol, stearic acid-polyglycol ester, oleic acid-polyglycol ester, stearyl alcohol-polyglycol ether, nonylphenyl polyglycol ether, octanediol through polyalkylene glycol ethers and polyoxypropylene glycol; and (c) an organic sulfur compound with water-soluble groups.

2. A galvanic acid copper bath according to claim 1, in which said amide is selected from the group consisting of acetamide, propionic acid amide, acrylic acid amide, benzoic acid amide, and polyacrylic acid amide.

3. A galvanic acid copper bath according to claim 2, wherein said polyacrylic acid amide is of the general formula

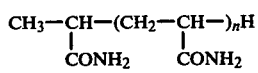

in which n is an integer from 1 to about 40.

4. A galvanic acid copper bath according to claim 3, in which n is an integer from 1 to 16.

5. A galvanic acid copper bath according to claim 3, in which the molecular weight of said polyacrylic acid amide is between 600 and 1000.

6. A galvanic acid copper bath according to claim 1, in which said organic sulfur compound with water-solubilizing groups is selected from the group consisting of an alkali metal salt of N,N-diethyl-dithiocarbamic acid-(ω-sulfopropyl)ester, mercaptobenzothiazol-S-propansulfonic acid, 3-mercaptopropan-1-sulfonic acid, thiophosphoric acid-O-ethyl-bis-(ω-sulfopropyl)ester, thiophosphoric acid-tris(ω-sulfopropyl)ester, isothiocyanopropylsulfonic acid, thioglycolic acid, ethylenedithiodipropylsulfonic acid, thioacetamid-S-propylsulfonic acid and di-n-propyl-thioether-di-ω-sulfonic acid.

7. A galvanic acid copper bath according to claim 6, in which said alkali metal is sodium.

8. A galvanic acid copper bath according to claim 1, in which said bath has a concentration range of 0.001 to 20 g/liter of said amide, 0.005 to 20 g/liter of said oxygen-containing high molecular weight compound, and 0.0005 to 0.2 g/liter of said organic sulfur compound with water-solubilizing groups.

9. A galvanic acid copper bath according to claim 1, in which said bath has a concentration range of 0.01 to 1 g/liter of said amide, 0.02 to 5.0 g/liter of said oxygen-containing high molecular weight compound, and 0.005 to 0.1 g/liter of said organic sulfur compound with water-solubilizing groups.

10. A method of depositing shiny copper coatings, particularly for the strengthening of the conductor paths of printed circuits, which comprises electroplating a material to be coated in a galvanic acid copper bath, comprising a standard aqueous bath of a copper salt and mineral acid, and added thereto (a) an amide of the general formula

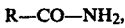

where R is an aliphatic or aromatic hydrocarbon monomer or polymer;

(b) an oxygen-containing, high molecular weight compound selected from the group consisting of the polyvinyl alcohol, carboxymethylcellulose, polyethylene glycol, polypropylene glycol, stearic acid-polyglycol ester, oleic acid-polyglycol ester, stearyl alcohol-polyglycol ether, nonylphenyl polyglycol ether, octanediol through polyalkylene glycol ethers and polyoxypropylene glycol; and (c) an organic sulfur compound with water-solubilizing groups.

* * * * *